United States Patent [19]
Wollesen et al.

[11] Patent Number: 5,972,725
[45] Date of Patent: Oct. 26, 1999

[54] DEVICE ANALYSIS FOR FACE DOWN CHIP

[75] Inventors: Donald L. Wollesen, Saratoga, Calif.;
Glen Gilfeather, Del Valle, Tex.

[73] Assignee: Advanced Micro Devices, Inc., Sunnyvale, Calif.

[21] Appl. No.: 08/988,868

[22] Filed: Dec. 11, 1997

[51] Int. Cl.$^6$ .................................................. H01L 29/34
[52] U.S. Cl. ................................ 438/14; 438/15; 438/17; 257/48; 29/593
[58] Field of Search ................................ 438/4, 14, 15, 438/16, 17, 18; 257/48; 29/593

[56] References Cited

U.S. PATENT DOCUMENTS

| | | | |
|---|---|---|---|
| 3,969,670 | 7/1976 | Wu | 438/17 |
| 4,109,029 | 8/1978 | Ozdemir et al. | 438/14 |
| 4,296,372 | 10/1981 | Feuerbaum | 327/767 |
| 4,453,127 | 6/1984 | Schick | 324/769 |
| 5,097,204 | 3/1992 | Yoshizawa et al. | 324/751 |
| 5,159,752 | 11/1992 | Mahant-Shetti et al. | 438/16 |
| 5,406,116 | 4/1995 | Wills et al. | 438/15 |
| 5,817,533 | 10/1998 | Sen et al. | 438/4 |

*Primary Examiner*—Donald L. Monin, Jr.
*Assistant Examiner*—Michael Dietrich
*Attorney, Agent, or Firm*—H. Donald Nelson

[57] ABSTRACT

A method of precisely measuring electrical parameters in integrated circuits in a face down semiconductor device in which a portion of the semiconductor substrate is removed from the semiconductor device and an SEM microprobe is directed onto selected regions of the surface exposed by the removal of the semiconductor substrate. The microprobe is directed to selected regions of the exposed surface by a computer generated mapping system. One of the selected regions that the microprobe is directed to is a region of the exposed surface overlying a depletion region associated with a drain of a transistor in the semiconductor device. The voltage variation on the exposed surface caused by the expansion and shrinking of the depletion region is measured by the microprobe. Another region that the microprobe is directed to is a region of the exposed surface overlying an insulator and the microprobe detects the voltage of a conducting electrode under the insulator is measured via capacitive coupling. A third region that the microprobe is directed to is a region overlying a reverse-biased junction in the semiconductor device and a change in voltage of the reverse-biased junction is determined by measuring the voltage variation of the depletion region associated with the reverse-biased junction.

5 Claims, 3 Drawing Sheets

DEVICE ANALYSIS FOR FACE DOWN CHIP

CROSS REFERENCE TO RELATED APPLICATIONS

This application is related to application, Ser. No. 08/988,681, filed on the filing date of this application, entitled BACKSIDE SILICON REMOVAL FOR FACE DOWN CHIP ANALYSIS and assigned to the assignee of this application.

BACKGROUND OF THE INVENTION

1. Field of the Invention

This invention relates generally to a method to precisely measure electrical parameters in integrated circuits in a semiconductor device. More specifically, this invention relates to a method to precisely measure electrical parameters in integrated circuits in a face down semiconductor device.

2. Discussion of the Related Art

The solder-bump flip-chip interconnection technology was initiated in the early 1960s to eliminate the expense, unreliability, and low productivity of manual wirebonding. The flip-chip or controlled-collapse-chip connection ($C^4$ or C4) technology utilizes solder bumps deposited on wettable metal terminals on the chip and joined to a matching footprint of solder wettable terminals on the substrate. The upside-down chip (flip-chip or face down chip) is aligned to the substrate, and all joints are made simultaneously by reflowing the solder.

Semiconductor die are subjected to two basic sets of test procedures. The first set of test procedures is conducted while the die are still in wafer form and the second set of test procedures is conducted after the die have been separated and have been packaged. Test procedures have been developed for the testing and analysis of semiconductor die that are packaged face up. Because the face of the semiconductor die is facing down in a flip-chip, the face is unavailable for the test procedures developed for the more conventional face up semiconductor die.

Historically, one of the primary integrated circuit tools for electrical waveform analysis at the small micron to submicron level is the "electron beam microprobe." The electron-beam microprobe is a specialized scanning electron microscope (SEM) configured to provide a visual image of integrated circuits on a die, with or without voltage contrast. Voltage contrast is available when the integrated circuits are electrically activated. The electron beam microprobes are navigated to specific nodes in the integrated circuit on the semiconductor die based upon a computer database containing the actual physical layout of the integrated circuit on the semiconductor die. Once a node in the integrated circuit that is to be tested is located, the electron beam is aimed at a specific conductive pattern on the die and senses what the electrical potential is at the node. Further actual electrical test patterns can be used to stimulate the device under test and the electron-beam's secondary electrons can be used to observe waveforms and timing patterns in the integrated circuit on the die. This capability is crucial during the debugging portion of the development phase of a new integrated circuit design and is a key tool to examine production test units and integrated circuits returned from field use. In order for an electron beam microprobe measurement system to work, the electron beam microprobe is best placed on a conductive interconnect line although alternating current (ac) charge can be sensed through a thickness of thousands of Angstroms (Å) of dielectric. However, the measurement conducted through dielectric having a significant thickness is not sufficiently accurate for precise determination of the electrical parameters of the integrated circuit.

Because the face of the flip-chip is facing down and is close to the packaging substrate, the conductive interconnect lines of the flip-chip are unavailable for the standard electron beam measurements.

Therefore, what is needed is a method of measuring electrical parameters of the face down semiconductor device from the backside of the semiconductor device using elements of the semiconductor device that are available for electron beam microprobe analysis.

SUMMARY OF THE INVENTION

A method of measuring electrical parameters in face down semiconductor devices in accordance with the present invention solves the above and other problems associated with testing face down semiconductor devices.

The above and other objects and advantages of the present invention are attained through a method of testing face down semiconductor devices in which a portion of the substrate of the face down semiconductor device is removed, a supply voltage is applied to the semiconductor device and a scanning electron microscope microprobe is directed to selected portions of the surface exposed by the removal of the substrate. The scanning electron microscope microprobe is directed to selected portions of the semiconductor device by a computer generated mapping system. The mapping system directs the microprobe to portions of the exposed surface under which regions of interest are located. The regions of interest will provide information concerning electrical parameters of the surrounding structures of the semiconductor device.

One of the selected regions that the microprobe is directed to is a region of the exposed surface overlying a depletion region associated with a drain or source of a transistor in the semiconductor device. The voltage variation on the exposed surface caused by the expansion and shrinking of the depletion region is measured by the microprobe. Another region that the microprobe is directed to is a region of the exposed surface overlying an insulator and the microprobe detects the voltage of a conducting electrode underlying the insulator via capacitive coupling. A third region that the microprobe is directed to is a region overlying a reverse-biased junction in the semiconductor device and a change in voltage of the reverse-biased junction is determined by measuring the voltage variation of the depletion region associated with the reverse-biased junction.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Figure 1A:
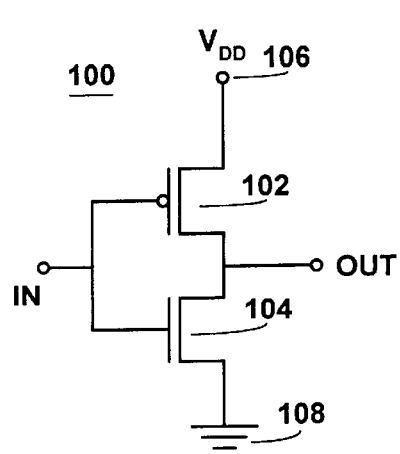
FIG. 1A is a schematic of an inverter.

Reference is now made in detail to a specific embodiment of the present invention that illustrates the best mode presently contemplated by the inventors for practicing the invention. Note that the conventions such as p+ and p− are given by way of example and that the corresponding dopant types and concentrations, although not critical to the present invention, would be apparent to a person skilled in the relevant art. The figures are diagrammatic and, for clarity, not drawn to scale. Corresponding parts are generally referred to by the same reference numerals.

FIG. 1A is a schematic of a simple CMOS inverter 100 that will be used to illustrate the concepts of the present invention. The CMOS inverter 100 includes a p channel transistor 102 and an n channel transistor 104. The drain of the p channel transistor 102 is connected to the drain of the n channel transistor 104 and the two transistors are connected in series between voltage input $V_{DD}$ 106 and ground 108. There is an input IN to the gates of transistors 102 and 104 and an output OUT from the common connection between the drain of p channel transistor 102 and the drain of n channel transistor 104.

Figure 1C:
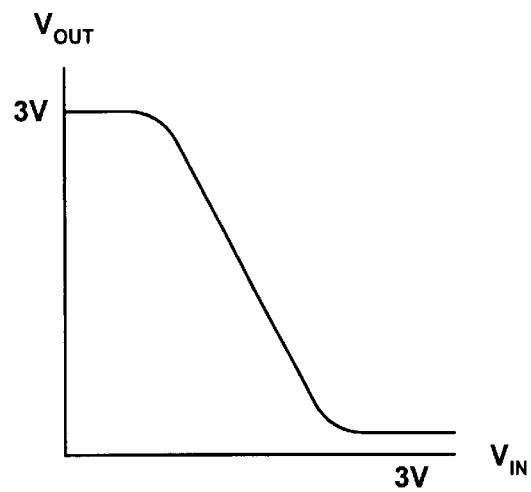
FIG. 1C is the I/O voltage transfer curve of the inverter shown in FIGS. 1A and 1B.
Figure 1B:
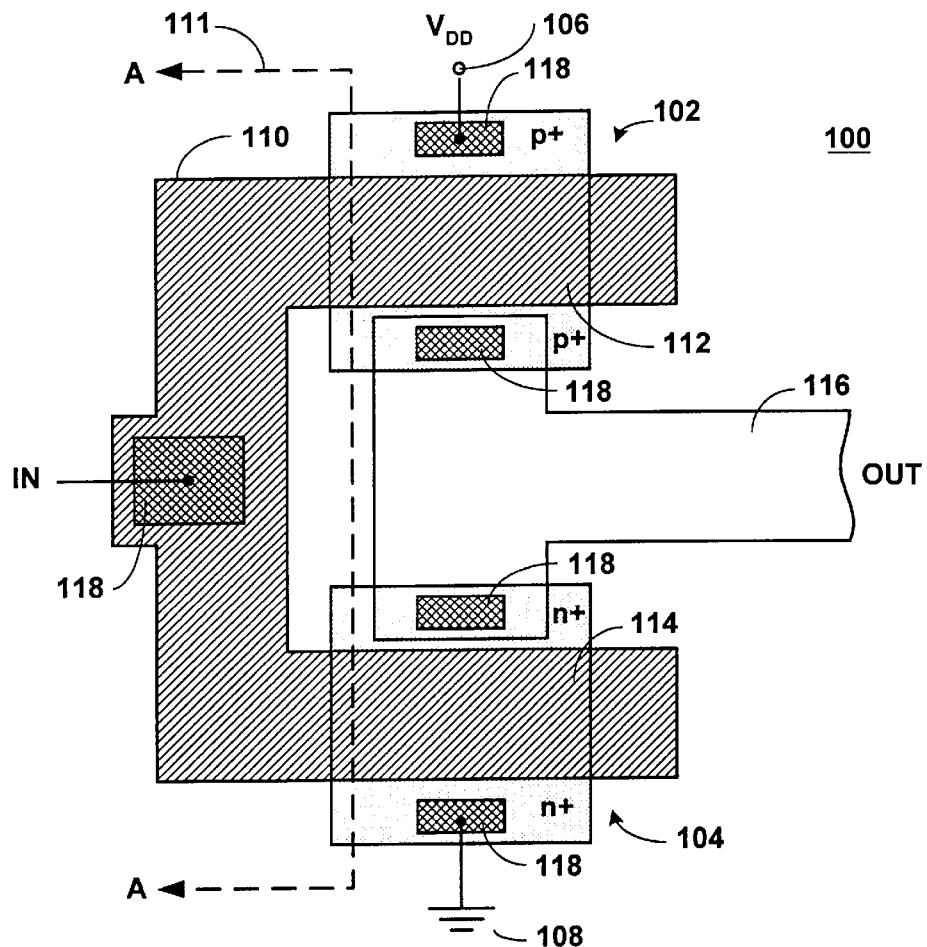
FIG. 1B is a layout of the inverter shown in FIG. 1A.

FIG. 1B is a layout of the inverter 100 shown in FIG. 1A as it could be fabricated on a semiconductor device. Common elements are denoted with common numerals. The structure 110 is an electrically conductive interconnect structure connecting the gate region 112 of the p channel transistor 102 to the gate region 114 of the n channel transistor 104. The structure 116 is an electrically conductive interconnect structure connecting the drain of p channel transistor 102 to the drain of n channel transistor 104. The structures 118 are vias to connect an electrically conductive element in one metal layer to an electrically conductive element in a second metal layer.

FIG. 1C illustrates the input/output (I/O) characteristics of the inverter 100 and shows that when the input $V_{IN}$ is low the output $V_{OUT}$ is high and vice versa. Although the voltage is shown as 3 volts, it should be understood that other voltages can be used.

The CMOS inverter 100 will be used as an example to illustrate the method of measuring electrical parameters in a face down semiconductor device. It should be understood that the method of measuring electrical parameters can be used to measure electrical parameters in NMOS, PMOS, or bipolar transistors.

Figure 2:
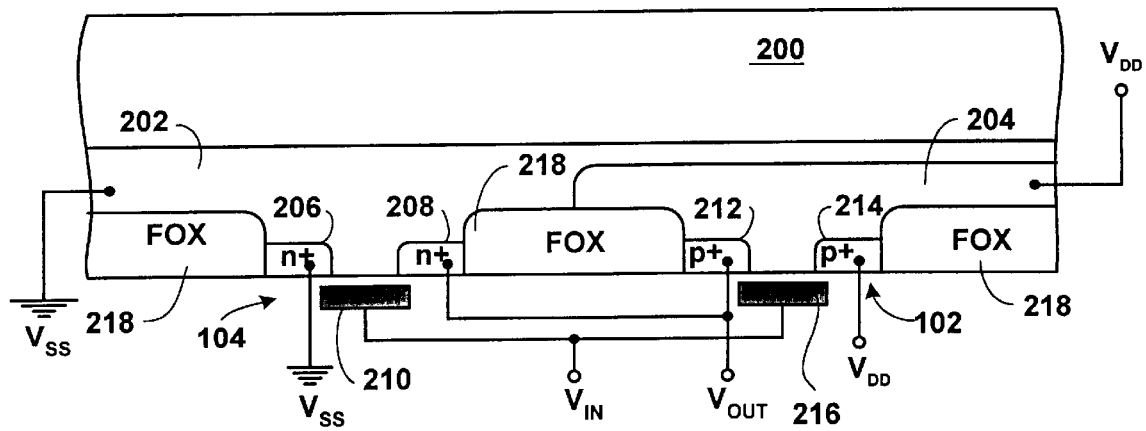
FIG. 2 shows a portion of the CMOS inverter in a face down orientation.
Figure 3:
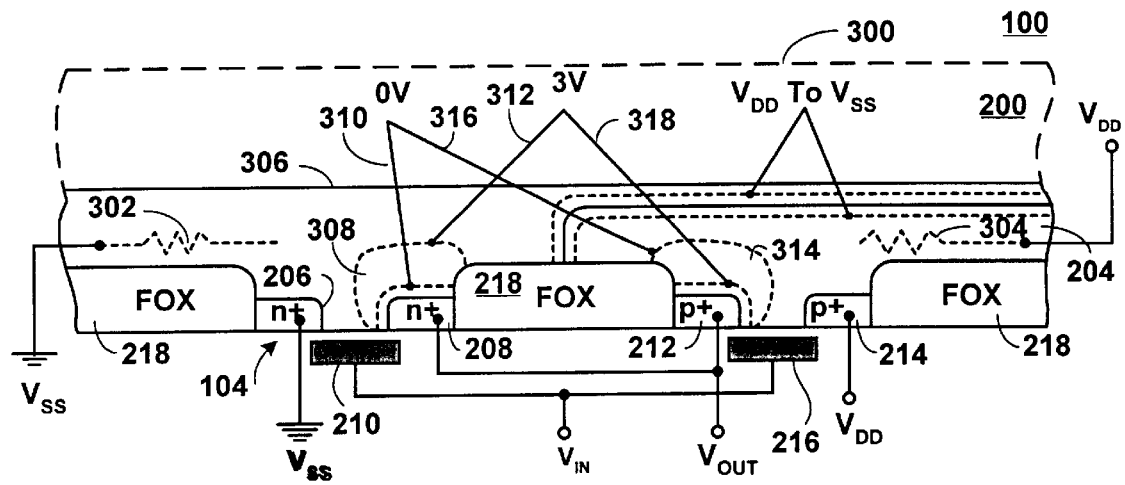
FIG. 3 shows details of the CMOS inverter shown in FIG. 2 with the backside silicon substrate removed.
Figure 4:
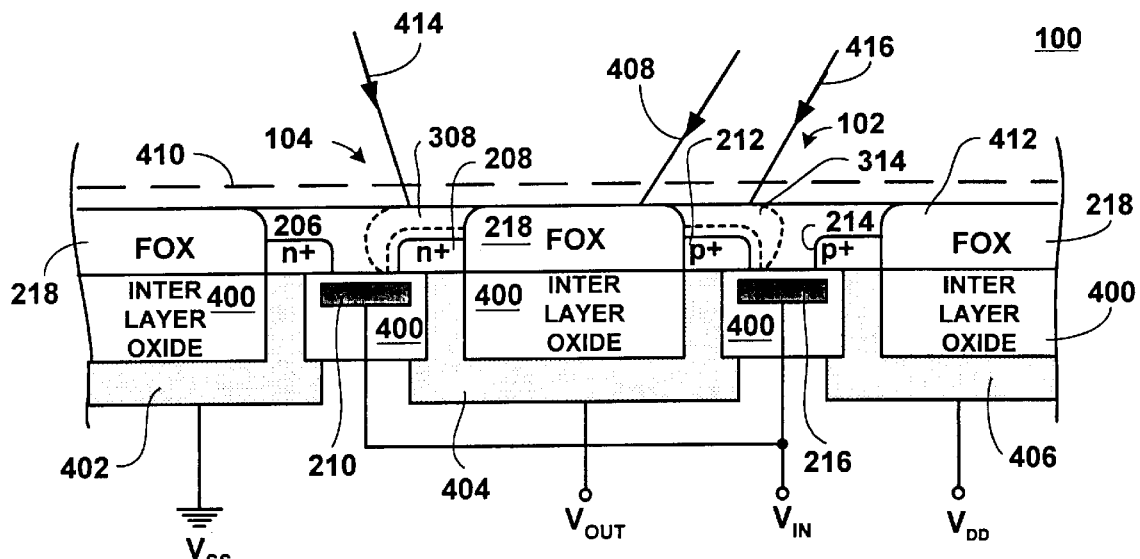
FIG. 4 shows further details of the CMOS inverter shown in FIGS. 2 and 3 showing details of device analysis with electron beam microprobes.

FIGS. 2, 3 & 4 illustrate Section AA in FIG. 1B as cross sections of the transistors 102 and 104 in the inverter 100. FIG. 2 shows a portion of the semiconductor structure including a portion of the backside semiconductor substrate 200, a p well region 202 and an n well region 204. The transistor 104 includes a source region 206, a drain region 208 and a gate region 210. The transistor 102 includes a drain region 212, a source region 214 and a gate region 216. The isolation regions 218 electrically isolate the transistors 102 and 104 from each other as well as from other portions of the semiconductor device. The p well 202 and the source 206 of transistor 104 are connected to ground $V_{SS}$. The n well 204 and the source 214 of transistor 102 are connected to $V_{DD}$. The gates 210 and 216 of transistors 104 and 102, respectively, are connected to $V_{IN}$.

FIG. 3 shows the structure shown in FIG. 2 in more detail and with the backside semiconductor substrate 200 removed. The removed portion of the backside semiconductor substrate 200 is shown in dashed outline 300. The backside semiconductor substrate 200 is removed by plasma etching in a fluorocarbon based chemical plasma. The method of removing the backside semiconductor substrate 200 is described in co-pending application Ser. No. 08/988, 681, entitled BACKSIDE SILICON REMOVAL FOR FACE DOWN CHIP ANALYSIS, assigned to the assignee of this application and which is incorporated herein in its entirety. The backside semiconductor substrate 200 may first be mechanically ground or polished prior to the plasma etching. The lateral resistance in the p well is represented at 302 and the lateral resistance in the n well is represented at 304. The dotted lines show the normal depletion spreads that occur on reverse biased-junctions and are regions of no free carriers. Each depletion region will be discussed in more detail below. A change in voltage at a reverse-biased junction results in a change in the associated depletion region. The depletion regions can also be viewed as an effective capacitor dielectric, that is, a change of voltage (V) results in a change of charge (Q) and a change in capacitance (C). The relationship between these values: Q=CV is also true for voltage changes, such as the one shown in FIG. 1C. The relationship for the delta values is:

dQ/dt=C dV/dt=i(amps) ac.

This indicates that a displacement current flows.

Those skilled in the art may conclude that the static potential (DC) on the upper surface 306 will be constant, that is, no ΔV. Because of this, it may be further concluded that there cannot be a potential difference on the surface 306 for a voltage contrast SEM to detect. However, there are at least three reasons why the lapped/etched ultra thin and lightly doped monocrystalline bulk silicon surface 306 will have voltage contrast or voltage gradients that are measurable by a voltage contrast SEM. First, as described above, p well region 202 is connected through lateral resistance 302 to ground $V_{SS}$ and n well region 204 is connected through lateral resistance 304 to supply voltage $V_{DD}$. These lateral resistances are typically several hundreds to several thousands ohms per square and the distance through the p well or n well to contacts is typically 1 square to many tens of squares. This means that the resistances can be from 1KΩ to tens of KΩs depending upon the layout of the integrated circuit. Therefore, any local current flow will result in an IR or voltage gradient in the particular well. This voltage gradient will be measurable by a voltage contrast electron beam microprobe SEM.

The second reason that the lapped/etched, ultra thin and lightly doped monocrystalline bulk silicon surface will have voltage contrast is that the electron beam is a beam of electrons, that is, a beam of current. The current/charge from the electron beam must go somewhere once it impacts the surface of the device being measured. If the beam is directed to an oxide, charge will accumulate in the oxide, if the beam is directed to a portion of bulk silicon, current will flow through either a lateral resistance or a depletion region. Because the electrons in an electron beam introduced into a p type material are minority carriers they will have a minority carrier lifetime that can vary from μseconds to seconds and they can have a range from nanometers to centimeters. For example, if an electron beam is positioned directly above an n+ drain in a p− background, a pseudo npn bipolar transistor is formed with the electron beam acting as the emitter, the p− region acts as the base and the n+ drain as the collector. As the n+ drain voltage transitions from ground $V_{SS}$ to $V_{DD}$ (3 V in FIG. 3), the β (Beta) of the pseudo npn bipolar transistor will increase. The increase of β causes the depletion region 308 to expand from an area indicated by 310 at 0 volts to an area indicated by 312 at 3 volts. Similarly, the increase of β causes the depletion region 314 to collapse from an area indicated by 316 to an area indicated by 318. The changes in the depletion regions 308 and 310 will cause the DC potential on the surface 306 to change and this change can be detected by the voltage contrast electron beam microprobe.

The third reason that the lapped/etched, ultra thin and lightly doped monocrystalline bulk silicon surface will have voltage contrast is that if a drain junction is switching there is a displacement current that will locally modulate the surface potential on the wafer backside surface 306. There is an RC time constant associated with the drain diode when it is switching and the well lateral resistance. For example, for a 100 ff drain capacitance and a 10 KΩ well lateral resistance, the time constant τ, is 100 ff×10 KΩ=1 nanosecond. Therefore, for a 100 picosecond rise time, (>>1 nanosecond), an ac surface potential will exist and the voltage contrast electron beam microprobe can read it.

FIG. 4 shows additional details of the structure 100 shown in FIG. 3. Portions of the first interlayer dielectric layer are shown at 400, an electrically conductive material is shown at 402 connecting the source 206 of transistor 104 to $V_{SS}$, an electrically conductive material is shown at 404 connecting the drain 208 of transistor 104 and the drain 212 of transistor 102 to $V_{OUT}$, and an electrically conductive material is shown at 406 connecting the source 214 of transistor 102 to $V_{DD}$. FIG. 4 also indicates that the backside silicon can be removed such that the "bottom" of the field oxide (FOX) layers 218 are exposed. This technique would typically be used in the case of recessed field oxide technologies. In this case, the electron beam microprobe measurement is made by placing the electron beam on a top of an insulator and a conducting electrode voltage beneath the insulator is sensed by the electron beam via capacitive coupling. In this case, the electron beam microprobe 408 would sense the voltage on the $V_{OUT}$ electrode. FIG. 4 also shows, in dashed outline 410, a thin insulator layer, such as $SiO_2$, deposited on the wafer backside in those cases in which a particular integrated circuit design is catastrophically disturbed by the electron beam, for example by latchup. With the thin layer of insulating material 410 in place, the gate transitions can be detected by displacement current from the drain junctions and drain interconnects through the insulator 410. A thickness on the order of tens of Angstroms of the insulating layer 410 would be sufficient to prevent latchup.

FIG. 4 also shows that when the remaining silicon substrate material is sufficiently thin, the depletion regions 308 and 314 extend to the lapped surface 412. The electron beam 414 probes the electrical potential at the portion of the surface 412 directly over the depletion region 308 to determine the voltage at the drain 208 of the n channel transistor 104. Similarly, the electron beam 416 probes the electrical potential at the portion of the surface 412 directly over the depletion region 314 to determine the voltage at the drain 212 of the p channel transistor 102. If the insulating layer 410 has been formed the electron beams 408, 414 and 416 would still function to determine the voltages as discussed above.

Figure 5:
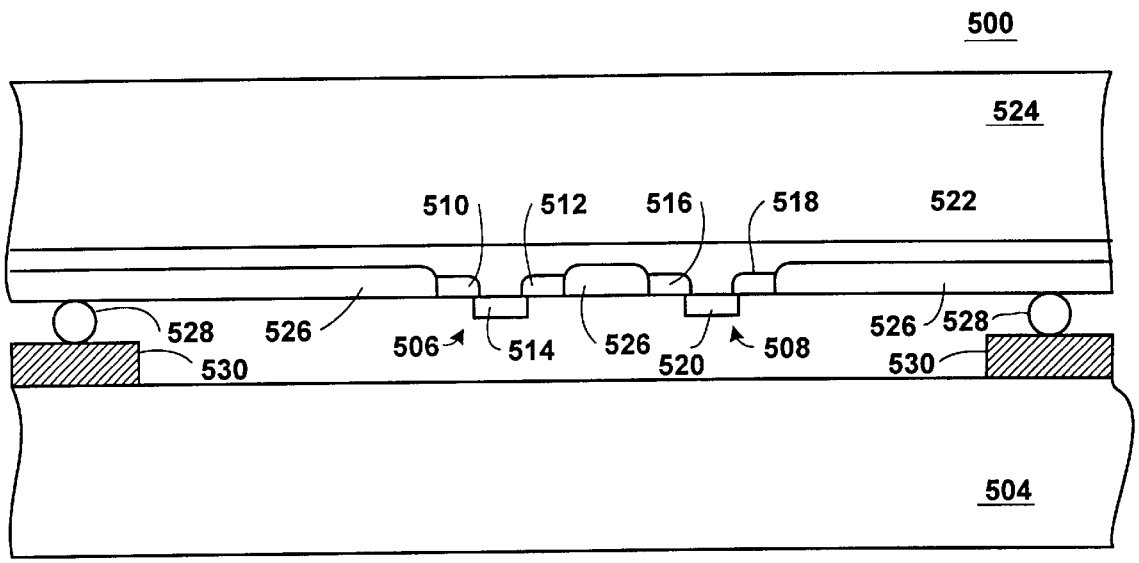
FIG. 5 shows a portion of a CMOS SOI inverter.

FIG. 5 shows a portion 500 of the inverter as discussed above but in a CMOS SOI (silicon on insulator) technology. The semiconductor device 502 is shown placed on a packaging substrate 504. An n channel transistor 506 and a p channel transistor 508 are shown. The n channel transistor 506 includes a source 510, a drain 512 and a gate 514. The p channel transistor 508 includes a drain 516, a source 518 and a gate 520. Not shown are the metal layers that are formed above the transistor structures. A buried oxide layer 522 serves to isolate the n channel transistor 506 and the p channel 508 from each other as well as from other portions of the semiconductor device. The buried oxide layer 522 is formed on the semiconductor substrate 524. Isolation structures 526 are formed to isolate the transistors 506 and 508 from each other and in conjunction with the buried oxide layer 522 serve to completely isolate each transistor from other portions of the semiconductor device. The semiconductor device is shown placed face down on the packaging substrate 504 with connections made through solder bumps 528 and solder wettable terminals 530 on the package 504.

Figure 6:
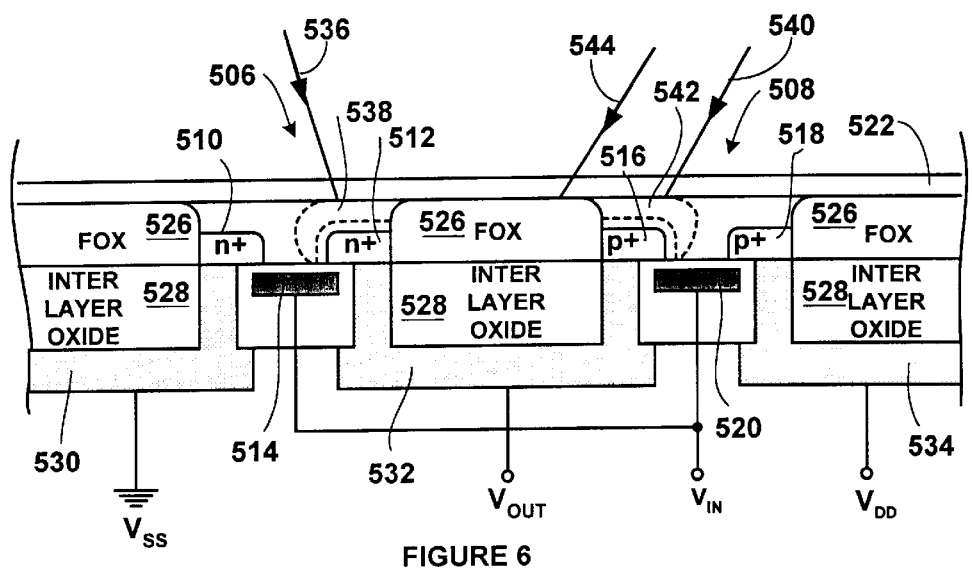
FIG. 6 shows details of the CMOS SOI inverter shown in FIG. 5 showing details of device analysis with electron beam microprobes.

FIG. 6 shows additional details of the structure 500 shown in FIG. 5. Portions of the first interlayer dielectric layer are shown at 528, an electrically conductive material is shown at 530 connecting the source 510 of transistor 506 to $V_{SS}$, an electrically conductive material is shown at 532 connecting the drain 512 of transistor 506 and the drain 516 of transistor 508 to $V_{OUT}$, and an electrically conductive material is shown at 534 connecting the source 518 of transistor 508 to $V_{DD}$. The electron beam 536 probes the electrical potential at the portion of the buried oxide layer 522 that is directly over the depletion region 538 to determine the voltage at the drain 512 of the n channel transistor 506. Similarly, the electron beam 540 probes the electrical potential at the portion of the buried oxide layer 522 directly over the depletion region 542 to determine the voltage at the drain 516 of the p channel transistor 508. The electron beam 544 would sense the voltage on the $V_{OUT}$ electrode. The gate transitions are detected through the insulator 522 and the field oxide layer 526 by displacement current. The advantage of the bottom side probing of SOI die is that the oxides are optically transparent and the navigation of the electron beam to any particular node may be done optically with the voltage contrast SEM image, since no topography is available, and with the die corners/edges as mechanical reference. Another advantage of backside electron beam probing is that every voltage node on the entire integrated circuit is available for probing. Every voltage node in not possible from the top of a face up semiconductor device.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method to precisely measure electrical parameters in integrated circuits in a face down semiconductor device, the method comprising:

removing a portion of a substrate from the semiconductor device thereby exposing a surface of the semiconductor device;

applying a supply voltage to the semiconductor device;

applying a test signal to the semiconductor device; and directing at least one scanning electron microscope microprobe to a region of the exposed surface overlying a reverse-biased junction in the semiconductor device and a change in voltage of the reverse-biased junction is determined by measuring the voltage variation of a depletion region associated with the reverse-biased junction.

2. The method of claim 1 wherein the at least one scanning electron microscope microprobe is directed to a region of the exposed surface overlying a reverse-biased junction in the semiconductor device by a computer generated mapping system.

3. The method of claim 1 further comprising forming a protective layer on the surface of the exposed surface of the semiconductor device.

4. The method of claim 3 wherein the protective layer is a thin layer of silicon dioxide.

5. The method of claim 4 wherein the protective layer has a thickness between ten and one thousand angstroms.

* * * * *